(12) United States Patent
Izawa

(10) Patent No.: US 10,266,064 B2
(45) Date of Patent: Apr. 23, 2019

(54) VOLTAGE DETECTING APPARATUS

(71) Applicant: YAZAKI CORPORATION, Tokyo (JP)

(72) Inventor: Takaaki Izawa, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 268 days.

(21) Appl. No.: 15/277,763

(22) Filed: Sep. 27, 2016

(65) Prior Publication Data

US 2017/0120769 A1 May 4, 2017

(30) Foreign Application Priority Data

Oct. 28, 2015 (JP) .................................. 2015-211434

(51) Int. Cl.
*B60L 11/18* (2006.01)
*H01M 10/42* (2006.01)
(Continued)

(52) U.S. Cl.
CPC ........ *B60L 11/1862* (2013.01); *G01R 31/396* (2019.01); *H01M 10/4285* (2013.01); *H01M 10/482* (2013.01); *H01M 2220/20* (2013.01)

(58) Field of Classification Search
CPC ............ B60L 11/1862; G01R 31/3658; H01M 10/4285; H01M 10/482; H01M 2220/20
(Continued)

(56) References Cited

U.S. PATENT DOCUMENTS

| 8,981,783 B2 * | 3/2015 | Fujimatsu ........... G01R 31/3658 324/434 |
| 2008/0001593 A1 * | 1/2008 | Odajima ............ G01R 31/3658 324/123 R |

(Continued)

FOREIGN PATENT DOCUMENTS

| CN | 103308861 A | 9/2013 |
| EP | 2 224 257 A2 | 9/2010 |

(Continued)

OTHER PUBLICATIONS

Japanese Office Action for the related Japanese Patent Application No. 2015-211434 dated Oct. 31, 2017.
(Continued)

*Primary Examiner* — Melissa J Koval
*Assistant Examiner* — Rahul Maini
(74) *Attorney, Agent, or Firm* — Kenealy Vaidya LLP

(57) ABSTRACT

A voltage detecting apparatus includes: an assembled battery made of plural cells, a self-diagnostic circuit, and a measuring part for measuring the plural cells or measuring a diagnostic voltage generated by the self-diagnostic circuit. Electric power is supplied to the self-diagnostic circuit by a charge pump circuit. The self-diagnostic circuit includes plural circuit elements connected in series, and a current path connected to the measuring part and formed in correspondence with each of the plural circuit elements, and the measuring part includes a multiplexer for switching a state of connection between each of the current paths and the circuit network. The measuring part determines whether or not the circuit network is normal based on a voltage dividing ratio by the circuit element corresponding to the current path switched by the multiplexer.

4 Claims, 5 Drawing Sheets

(51) Int. Cl.
 *H01M 10/48* (2006.01)
 *G01R 31/36* (2019.01)
 *G01R 31/396* (2019.01)

(58) Field of Classification Search
 USPC .......................................................... 324/434
 See application file for complete search history.

(56) References Cited

U.S. PATENT DOCUMENTS

| | | |
|---|---|---|
| 2010/0244847 A1 | 9/2010 | Kudo et al. |
| 2010/0315037 A1 | 12/2010 | Kiura et al. |
| 2012/0242290 A1 | 9/2012 | Asakura |
| 2013/0241566 A1 | 9/2013 | Sugimura |
| 2014/0159739 A1 | 6/2014 | Kudo et al. |
| 2015/0280469 A1* | 10/2015 | Wang ..................... G01R 31/36 320/134 |
| 2016/0131717 A1 | 5/2016 | Sugimura et al. |
| 2016/0303977 A1 | 10/2016 | Kudo et al. |

FOREIGN PATENT DOCUMENTS

| | | |
|---|---|---|
| JP | 3-188378 A | 8/1991 |
| JP | 2003-304646 A | 10/2003 |
| JP | 2010-249793 A | 11/2010 |
| JP | 2010-283955 A | 12/2010 |
| JP | 2013-7573 A | 1/2013 |
| JP | 2014-240818 A | 12/2014 |
| WO | 2012/029221 A1 | 3/2012 |

OTHER PUBLICATIONS

Japanese Office Action for the related Japanese Patent Application No. 2015-211434 dated May 8, 2018.
German Office Action for the related German Patent Application No. 10 2016 220 958.2 dated Dec. 13, 2018.
Chinese Office Action for the related Chinese Patent Application No. 201610963804.0 dated Dec. 26, 2018.

* cited by examiner

VOLTAGE DETECTING APPARATUS

CROSS REFERENCE TO RELATED APPLICATION

This application is based on Japanese Patent Application (No. 2015-211434) filed on Oct. 28, 2015, the contents of which are incorporated herein by reference. Also, all the references cited herein are incorporated as a whole.

BACKGROUND OF THE INVENTION

1. Technical Field

The present invention relates to a voltage detecting apparatus.

2. Background Art

Conventionally, a secondary battery mounted in a hybrid vehicle or an electric vehicle is a battery formed by connecting plural cells in series, and is used as a power supply source of a motor for driving. Since such a secondary battery may deteriorate due to secular use of each of the cells, a diagnostic device for diagnosing whether or not a charging voltage of each of the cells is normal is formed.

Also, such a diagnostic device includes a device for detecting whether or not a circuit network configured in a path ranging from a detection path of a cell to an AD converting part is abnormal (for example, see Patent Reference 1).

In a technique described in Patent Reference 1, an intrinsic diagnostic voltage corresponding to a channel for detection of each of the cells is generated by resistively dividing a reference voltage. The generated intrinsic diagnostic voltage is inputted to the AD converting part by selectively controlling the path of the circuit network. The diagnostic voltage inputted to the AD converting part is converted into a diagnostic voltage value of a digital value, and is compared with an ideal value.

When a broken wire, an abnormal short circuit, a very small leakage current, etc. occur in the circuit network, a difference between the diagnostic voltage value and the ideal value is caused, and it is determined whether or not the circuit network is abnormal by determining whether or not its difference is within a determination threshold value.

Patent Reference 1 is JP-A-2014-240818.

SUMMARY OF THE INVENTION

However, in the technique described in Patent Reference 1, the voltage range in which the diagnostic voltage can be inputted is smaller than an actual use value and is limited. Hence, there is a fear that a leakage fault tending to occur in a path to which a high voltage is applied cannot be detected with high accuracy.

The invention has been implemented in view of such circumstances, and an object of the invention is to provide a voltage detecting apparatus capable of high-accuracy detection while expanding an input voltage range of a diagnostic voltage from a low voltage to a high voltage.

A voltage detecting apparatus according to the invention is the voltage detecting apparatus for determining whether or not a circuit network including a part of a measuring part is normal, including an assembled battery made of plural cells, a self-diagnostic circuit, and the measuring part for measuring the plural cells or measuring a diagnostic voltage generated by the self-diagnostic circuit, wherein electric power is supplied to the self-diagnostic circuit by a charge pump circuit, the self-diagnostic circuit includes plural circuit elements connected in series, and a current path connected to the measuring part and formed in correspondence with each of the plural circuit elements, and the measuring part includes a multiplexer for switching a state of connection between each of the current paths and the circuit network, and the measuring part determines whether or not the circuit network is normal based on a voltage dividing ratio by the circuit element corresponding to the current path switched by the multiplexer.

According to the voltage detecting apparatus according to the invention, high-accuracy detection can be performed while expanding an input voltage range of the diagnostic voltage from a low voltage to a high voltage.

Also, in the voltage detecting apparatus according to the invention, preferably, the self-diagnostic circuit further includes a capacitor for sharing the voltage dividing ratio by the circuit element as a capacitive voltage dividing ratio, and the measuring part determines that the circuit network is normal when the capacitive voltage dividing ratio is equal to a reference capacitive voltage dividing ratio serving as a criterion of the capacitive voltage dividing ratio, and determines that the circuit network is abnormal when the capacitive voltage dividing ratio is different from the reference capacitive voltage dividing ratio.

According to this voltage detecting apparatus, by making a determination by the capacitive voltage dividing ratio, the voltage dividing circuit configuration itself can freely be changed and also, diagnostic accuracy can be improved more remarkably than ever before in terms of detection of a leakage fault at the time of applying a high voltage.

Also, in the voltage detecting apparatus according to the invention, preferably, the self-diagnostic circuit further includes a resistor for sharing the voltage dividing ratio by the circuit element as a resistive voltage dividing ratio, and a capacitor corresponding to the resistive voltage dividing ratio, and the measuring part determines that the circuit network is normal when the resistive voltage dividing ratio is equal to a reference resistive voltage dividing ratio serving as a criterion of the resistive voltage dividing ratio, and determines that the circuit network is abnormal when the resistive voltage dividing ratio is different from the reference resistive voltage dividing ratio.

According to this voltage detecting apparatus, by making a determination by the resistive voltage dividing ratio, the voltage dividing circuit configuration itself can freely be changed and also, the diagnostic accuracy can be improved more remarkably than ever before in terms of detection of the leakage fault at the time of applying the high voltage.

Also, in the voltage detecting apparatus according to the invention, preferably, an opening/closing switch for opening and closing a charging path between the charge pump circuit and the self-diagnostic circuit is further included, and the measuring part measures the voltage dividing ratio by the circuit element when the capacitor is charged by the charge pump circuit and the charging path is opened by the opening/closing switch.

According to this voltage detecting apparatus, connection of the circuit network including the measuring part, the current paths and power source paths can be checked and also, the leakage fault can be detected by voltage detection using the diagnostic voltage corresponding to the actual assembled battery.

The invention can determine whether or not the circuit network is normal based on the relative reference by determining whether or not the circuit network including the measuring part is normal based on the voltage dividing ratio generated inside the self-diagnostic circuit, with the result that the voltage detecting apparatus capable of high-accuracy detection while expanding the input voltage range of the diagnostic voltage from the low voltage to the high voltage can be provided.

DETAILED DESCRIPTION OF THE EXEMPLARY EMBODIMENTS

Figure 1:
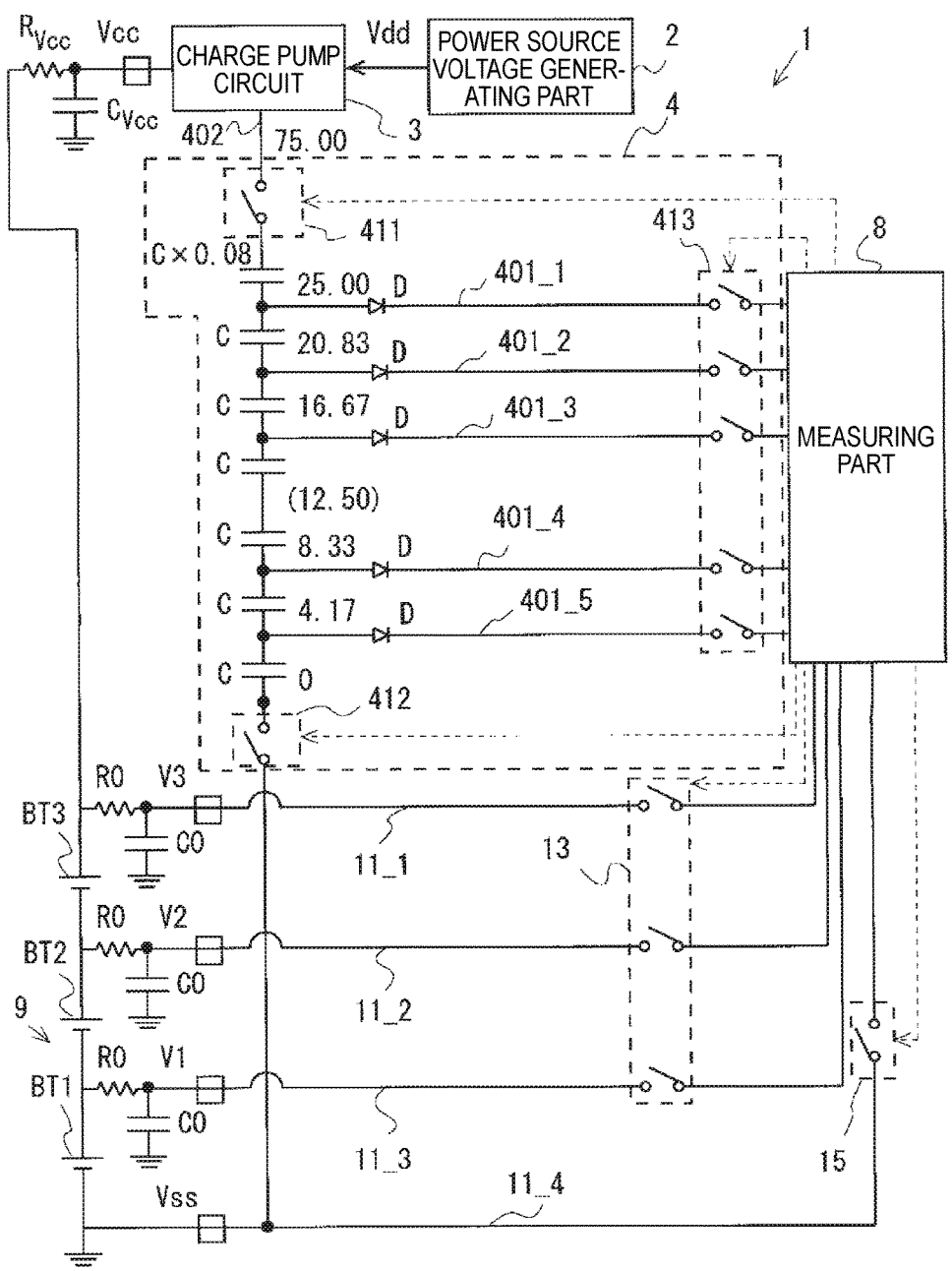
FIG. 1 is a diagram showing a circuit configuration example of a voltage detecting apparatus 1 according to a first embodiment.

FIG. 1 is a diagram showing a circuit configuration example of a voltage detecting apparatus 1 according to a first embodiment. As shown in FIG. 1, the voltage detecting apparatus 1 includes a power source voltage generating part 2, a charge pump circuit 3, a self-diagnostic circuit 4, a measuring part 8, etc. The voltage detecting apparatus 1 determines whether or not a circuit network including the measuring part 8 is normal.

The voltage detecting apparatus 1 is provided with an assembled battery 9, and connection between the measuring part 8 and the assembled battery 9 is made by a cut off switch 13. That is, the cut off switch 13 opens and closes the connection between the measuring part 8 and the assembled battery 9, and is constructed so that the assembled battery 9 can be separated from the circuit network including the measuring part 8.

The assembled battery 9 is a power source of a high voltage, and a vehicle is equipped with the assembled battery 9 to which, for example, plural cells BT1 to BT3 are connected. The assembled battery 9 is connected to the measuring part 8 through power source paths 11_1 to 11_3. In addition, when any of the power source paths 11_1 to 11_3 are not particularly limited, the power source paths 11_1 to 11_3 are called the power source paths 11.

In addition, the assembled battery 9 could be a battery such as a primary battery or a secondary battery for supplying a stable DC voltage.

Electric power is supplied to the self-diagnostic circuit 4 by the charge pump circuit 3. The self-diagnostic circuit 4 includes plural circuit elements connected in series, and current paths 401_1 to 401_5 connected to the measuring part 8 and formed in correspondence with the plural circuit elements.

Concretely, the self-diagnostic circuit 4 includes capacitors C each for sharing a voltage dividing ratio by the circuit element as a capacitive voltage dividing ratio. The self-diagnostic circuit 4 includes a connection switch 413. The connection switch 413 switches a state of connection between each of the current paths 401_1 to 401_5 and the circuit network including the measuring part 8.

In the voltage dividing ratio by the circuit element, various voltage dividing ratios can be selected by setting a balance of the capacitor C at any value and pulling the current paths 401_1 to 401_5 out of any point of a capacitor array.

Each of the current paths 401_1 to 401_5 is provided with a diode D, and the anode side is connected to the side of the capacitor C, and the cathode side is connected to the connection switch 413. The diode D inhibits an electric charge instantaneously charged into the capacitor C from being lost involuntarily.

In addition, when any of the current paths 401_1 to 401_5 are not particularly limited, the current paths 401_1 to 401_5 are called the current paths 401.

Figure 2:
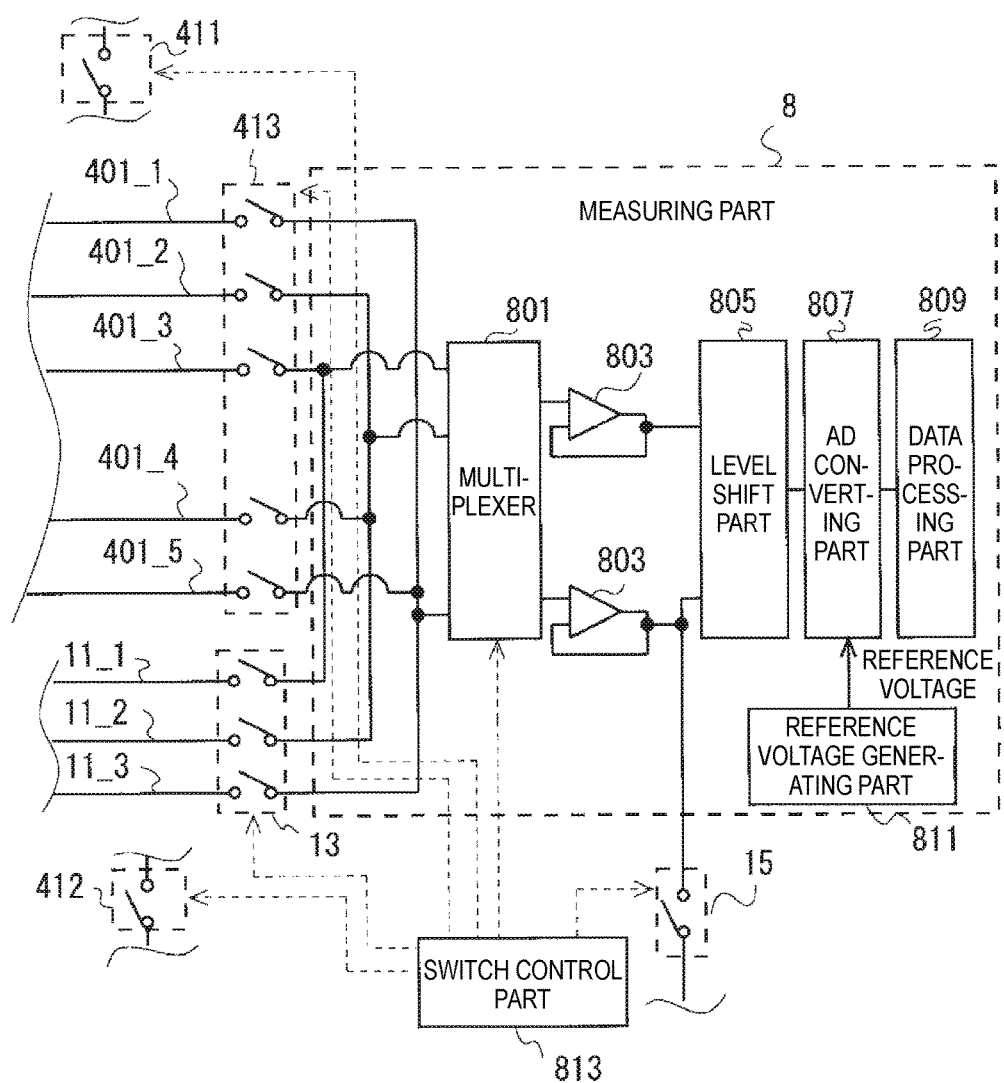
FIG. 2 is a diagram showing a circuit configuration example of a measuring part 8 according to the first embodiment.

The measuring part 8 is connected to the self-diagnostic circuit 4, and measures a voltage generated in the self-diagnostic circuit 4. Next, the measuring part 8 will be described concretely using FIG. 2. FIG. 2 is a diagram showing a circuit configuration example of the measuring part 8 according to the first embodiment.

After connection between the measuring part 8 and the assembled battery 9 is opened by the cut off switch 13, the measuring part 8 closes the connection switch 413 and measures a diagnostic voltage generated in the self-diagnostic circuit 4. Based on the measured voltage and the known voltage dividing ratio by the circuit element, the measured voltage is compared with the voltage dividing ratio, and it is determined whether or not the circuit network is normal.

Concretely, the measuring part 8 determines that the circuit network is normal when the capacitive voltage dividing ratio obtained by the measurement is equal to a known reference capacitive voltage dividing ratio which is a criterion of its capacitive voltage dividing ratio. On the other hand, the measuring part 8 determines that the circuit network is abnormal when the capacitive voltage dividing ratio is different from the reference capacitive voltage dividing ratio serving as the criterion of its capacitive voltage dividing ratio.

Next, the self-diagnostic circuit 4 will be described concretely.

At the time of diagnosing the circuit network, the cut off switch 13 formed on the power source paths 11 is opened, and all the switches of the inside of the self-diagnostic circuit 4, that is, opening/closing switches 411, 412 and the connection switch 413 are closed.

In the case of using the assembled battery 9, a diagnostic voltage (not shown) could be generated based on a total voltage of the assembled battery 9. Also, in the case of using the charge pump circuit 3 in addition to the assembled battery 9, the diagnostic voltage (not shown) could be generated based on a voltage in which a boost voltage by the charge pump circuit 3 is added to the total voltage of the assembled battery 9.

The voltage of the assembled battery 9 normally varies according to operation of a load (not shown). Hence, in FIG. 1, a voltage of a Vcc part is preferably applied through a low-pass filter with a large time constant.

Also, in the case of using the assembled battery 9, the self-diagnostic circuit 4 charges the capacitors C serving as a capacitive component so as to generate the diagnostic voltage (not shown) based on a certain instantaneous voltage of the assembled battery 9 in order to avoid a wrong diagnosis due to variations in voltage of the assembled battery 9. After the completion of charging, the assembled battery 9 is separated from the self-diagnostic circuit 4. Also, in the case of using the assembled battery 9 and the charge pump circuit 3, the self-diagnostic circuit 4 charges the capacitor C by the assembled battery 9 and the charge pump circuit 3. After the completion of charging, the assembled battery 9 and the charge pump circuit 3 are separated from the self-diagnostic circuit 4.

Also, the measuring part 8 includes a multiplexer 801, buffer amplifiers 803, a level shift part 805, an AD converting part 807, a data processing part 809, and a reference voltage generating part 811.

The multiplexer 801 selects one set of possible combinations among the power source paths 11_1 to 11_3 and a Vss part in a state in which all the switches of the cut off switch 13 are closed and all the switches of the connection switch 413 are opened at the time of normal measurement of the cells.

For example, in the case of measuring the cell BT1, the power source path 11_3 and the Vss part are selected. In the case of measuring the cell BT2, the power source path 11_2 and the power source path 11_3 are selected. In the case of measuring the cell BT3, the power source path 11_1 and the power source path 11_2 are selected.

The current paths 401 which are output paths of the self-diagnostic circuit 4 correspond to the power source paths 11. One set of possible combinations among the current paths 401_1 to 401_5 is set in a state in which all the switches of the cut off switch 13 are opened and all the switches of the connection switch 413 are closed at the time of a self-diagnosis.

For example, in the case of measuring a diagnostic voltage corresponding to the cell BT1, the current path 401_1 and the Vss part are selected. In the case of measuring a diagnostic voltage corresponding to the cell BT2, the current path 401_2 and the current path 401_5 are selected. In the case of measuring a diagnostic voltage corresponding to the cell BT3, the current path 401_3 and the current path 401_4 are selected.

That is, as operation of the multiplexer 801, an operation sequence in the case of measuring the cells BT1 to BT3 is equal to that in the case of measuring the diagnostic voltages. Switching of the voltages for their measurements is controlled by the cutoff switch 13 and the connection switch 413. In addition, when any of the cells BT1 to BT3 are not particularly limited, the cells BT1 to BT3 are called the cells BT.

The buffer amplifier 803 prevents interference between the side of the multiplexer 801 and a circuit subsequent to the level shift part 805 by adjusting impedance. The level shift part 805 makes a level shift of a voltage signal which is an output from the multiplexer 801 inputted through the buffer amplifier 803.

The AD converting part 807 digitizes the level-shifted voltage signal supplied from the level shift part 805 based on a reference voltage supplied from the reference voltage generating part 811. The reference voltage is a voltage for defining the amount of one bit of a digital value which is an output of the AD converting part 807. The reference voltage generating part 811 generates the reference voltage, and also has high voltage accuracy with respect to temperature.

The data processing part 809 determines whether or not the voltage measured by using the voltage signal outputted from the AD converting part 807 is abnormal based on the voltage dividing ratio by the circuit element.

Figure 3:
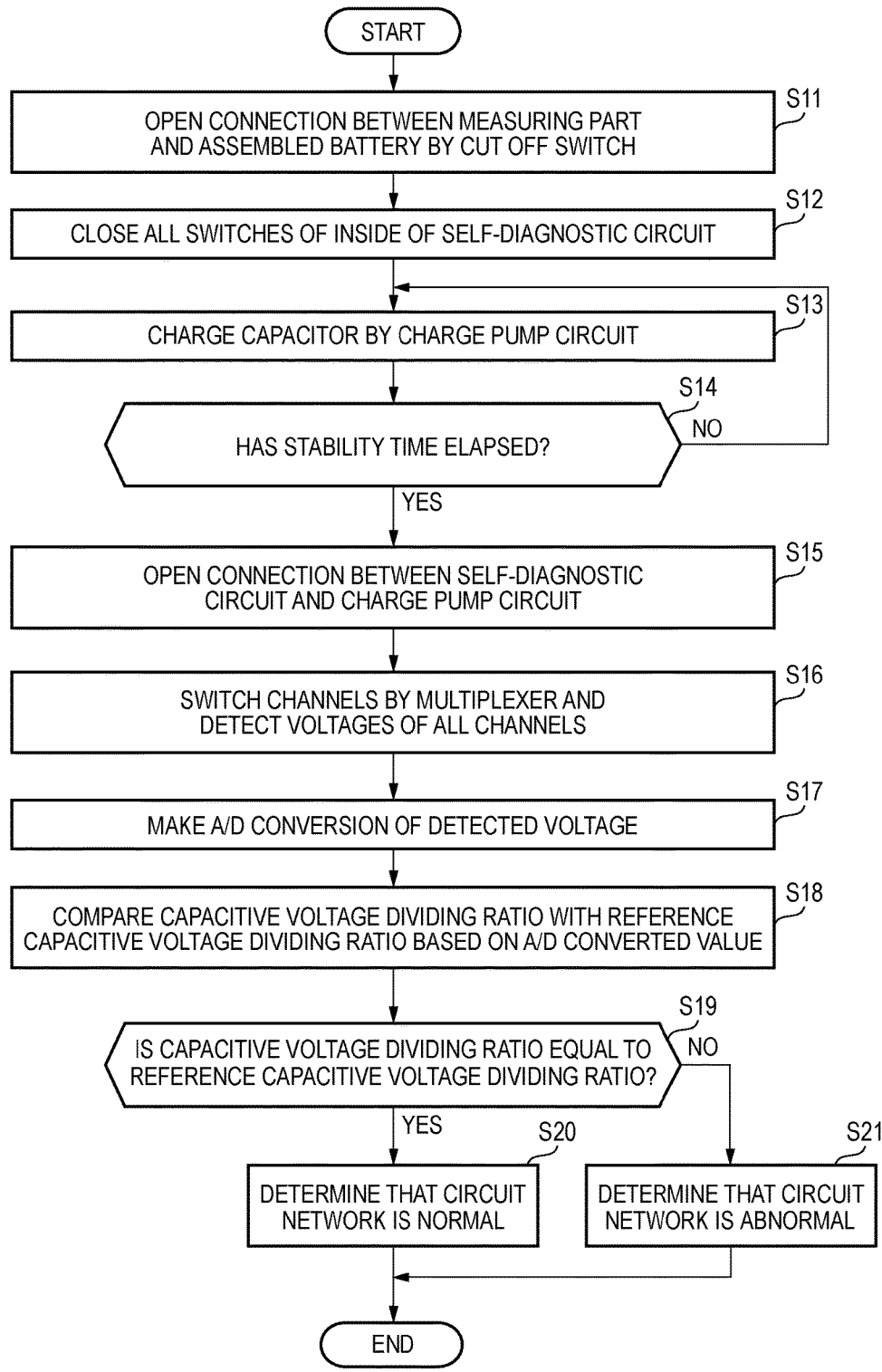
FIG. 3 is a flowchart describing a control example of the voltage detecting apparatus 1 according to the first embodiment.

Next, operation of determining whether or not the circuit network including the measuring part 8 is normal by the data processing part 809 will be described using FIG. 3. FIG. 3 is a flowchart describing a control example of the voltage detecting apparatus 1 according to the first embodiment.

(Step S11)
The voltage detecting apparatus 1 opens connection between the measuring part 8 and the assembled battery 9 by the cut off switch 13.

(Step S12)
The voltage detecting apparatus 1 closes all the switches of the inside of the self-diagnostic circuit 4. The self-diagnostic circuit 4 includes the opening/closing switches 411, 412 and the connection switch 413. Hence, the opening/closing switches 411, 412 and the connection switch 413 are closed.

(Step S13)
The voltage detecting apparatus 1 charges the capacitors C by the charge pump circuit 3. Concretely, a voltage is applied to each of the plural capacitors C connected in series, and each of the capacitors C is charged.

(Step S14)
The voltage detecting apparatus 1 determines whether or not stability time has elapsed. When the stability time has elapsed, the flowchart proceeds to processing of step S15. On the other hand, when the stability time has not elapsed, the voltage detecting apparatus 1 waits as it is.

Here, the stability time refers to time which it takes the voltages of the capacitors C to reach prescribed values. Also, the prescribed value may be a value at the time of fully charging the capacitor C. Also, the prescribed value may be a value in which a capacity of the capacitor C is a predetermined capacity, for example, 60% of the fully charged capacity. Also, the prescribed value may be time taken to reach a predetermined capacity according to a capacity of the capacitor C. That is, the capacitor C has only to be charged so that a capacitive voltage dividing ratio of the capacitor C can be measured.

(Step S15)
The voltage detecting apparatus 1 opens connection between the self-diagnostic circuit 4 and the charge pump circuit 3. Concretely, the voltage detecting apparatus 1 breaks a charging path 402 between the charge pump circuit 3 and the self-diagnostic circuit 4 by opening the opening/closing switch 411.

In addition, it is unnecessary to open the opening/closing switch 412 for connecting a path to the side of the Vss part until a diagnosis of the circuit network including the measuring part 8 is completed. When the self-diagnostic circuit 4 is completely separated from other circuits after the diagnosis of the circuit network including the measuring part 8 is completed, the opening/closing switch 412 has only to be opened.

(Step S16)
The voltage detecting apparatus 1 switches channels by the multiplexer 801, and detects voltages of all the channels. At this time, all the channels of the connection switch 413 are closed. Also, the flow itself of measurement of voltages of the cells BT1 to BT3 is used as a measuring procedure.

Concretely, the voltage detecting apparatus 1 makes the measuring part 8 measure a diagnostic voltage (not shown) of 25 (V) corresponding to the cell BT1 by selecting the current path 401_1 and the Vss part by controlling the multiplexer 801.

Also, the voltage detecting apparatus 1 selects the current paths 401_2, 401_5 by controlling the multiplexer 801. Hence, a difference between 20.83 (V) and 4.17 (V) can be measured as shown in FIGS. 1 and 2. Consequently, a diagnostic voltage (not shown) of 16.67 (V) corresponding to the cell BT2 can be measured by the measuring part 8. In addition, the numerical values described above are one example, and are not particularly limited to these values.

Also, the voltage detecting apparatus 1 selects the current paths 401_3, 401_4 by controlling the multiplexer 801. Hence, a difference between 16.67 (V) and 8.33 (V) can be measured as shown in FIGS. 1 and 2. Consequently, a diagnostic voltage (not shown) of 8.33 (V) corresponding to the cell BT3 can be measured by the measuring part 8. In addition, the numerical values described above are one example, and are not particularly limited to these values.

That is, the voltage detecting apparatus 1 supplies an analog voltage signal selected by the multiplexer 801 to the AD converting part 807 through each of the channels formed by the buffer amplifiers 803 and the level shift part 805.
(Step S17)

The voltage detecting apparatus 1 makes A/D conversion of the detected voltage. Concretely, the voltage detecting apparatus 1 converts an analog voltage signal supplied from the level shift part 805 into a digital voltage signal by the AD converting part 807, and supplies the voltage signal to the data processing part 809.
(Step S18)

The data processing part 809 compares a capacitive voltage dividing ratio with a reference capacitive voltage dividing ratio based on an A/D converted value. In addition, the A/D converted value refers to the digital voltage signal converted by the AD converting part 807.
(Step S19)

The data processing part 809 compares whether or not the capacitive voltage dividing ratio is equal to the reference capacitive voltage dividing ratio. When the capacitive voltage dividing ratio is equal to the reference capacitive voltage dividing ratio, the flowchart proceeds to processing of step S20. On the other hand, when the capacitive voltage dividing ratio is not equal to the reference capacitive voltage dividing ratio, the flowchart proceeds to processing of step S21.
(Step S20)

The data processing part 809 determines that the circuit network is normal, and the processing is ended.
(Step S21)

The data processing part 809 determines that the circuit network is abnormal, and the processing is ended.

For example, a relation among the diagnostic voltage corresponding to the cell BT1, the diagnostic voltage corresponding to the cell BT2 and the diagnostic voltage corresponding to the cell BT3=3:2:1 holds for the diagnostic voltage (not shown) described above. This relation of a voltage ratio does not depend on respective voltages of the cells BT1 to BT3 and the charge pump circuit 3.

That is, in the case of superimposing noise on the cells BT1 to BT3 or in the case of having variations due to its load, the diagnostic voltage ratio does not vary even when respective absolute values of the diagnostic voltages obtained by diagnoses vary. Hence, a check of the diagnostic voltage ratio can determine whether the circuit network including the multiplexer 801, the buffer amplifiers 803, the level shift part 805, the AD converting part 807 and the data processing part 809 is normal or abnormal.

As described above, the voltage detecting apparatus 1 presets the diagnostic voltage ratio every channel, and detects the diagnostic voltage (not shown) through the current path 401 by its channel. The voltage detecting apparatus 1 determines whether or not the circuit network including the measuring part 8 is abnormal by determining whether or not to have variations in the diagnostic voltage ratio set every channel.

That is, the voltage detecting apparatus 1 detects whether or not the circuit network of a detection system including the measuring part 8 is abnormal rather than directly detecting whether or not the assembled battery 9 is abnormal. Since a voltage range capable of being applied to the detection system in determination by the diagnostic voltage ratio using the total voltage of the assembled battery 9 as described in the present embodiment is wider than that of the conventional technique, the determination can be made while applying a high voltage.

Hence, the voltage detecting apparatus 1 can freely set the diagnostic voltage (not shown) for a voltage less than or equal to the total voltage applied to the self-diagnostic circuit 4 and also, even when the voltage of each of the cells BT1 to BT3 varies greatly depending on instantaneous charging using the capacitor C, the diagnostic voltage ratio used in a diagnosis does not vary, with the result that a fear of a wrong diagnosis is very low. Also, in a diagnostic result, a design ideal value is compared with a digital value of an AD converted value, with the result that the diagnostic result can be ensured with high accuracy.

In other words, the voltage detecting apparatus 1 can determine whether or not the circuit network is normal based on the relative reference by determining whether or not the circuit network including the measuring part 8 is normal based on the voltage dividing ratio generated inside the self-diagnostic circuit 4, with the result that high-accuracy detection can be performed while expanding an input voltage range of the diagnostic voltage (not shown) from a low voltage to a high voltage.

Also, the self-diagnostic circuit 4 includes the capacitor C for sharing the voltage dividing ratio by the circuit element as the capacitive voltage dividing ratio. The measuring part 8 determines whether or not the circuit network including the measuring part 8 is normal based on the capacitive voltage dividing ratio and the reference capacitive voltage dividing ratio.

Hence, the diagnostic voltage (not shown) is generated by a circuit configuration by capacitive voltage dividing. As a result, it can be determined that the circuit network is normal when the diagnostic voltage (not shown) keeps the voltage ratio corresponding to each of the cells BT and also keeps the voltage ratio of each of the channels including the current paths 401.

Also, in the example described above, the diagnostic voltage (not shown) is generated using one cell BT as an upper limit of the diagnostic voltage, that is, the reference, with the result that the voltage dividing circuit configuration itself can freely be changed though a maximum applied voltage is decreased.

For example, the uppermost channel can be changed into a voltage substantially similar to a battery voltage of the assembled battery 9. That is, any voltage less than or equal to a battery voltage equivalent to the assembled battery 9 can be applied to the charging path 402. Further, the diagnostic voltage (not shown) can be set at a voltage more than or equal to a reference power source voltage by controlling the diagnostic voltage (not shown) using the diagnostic voltage ratio. Consequently, diagnostic accuracy can be improved more remarkably than ever before in terms of detection of a leakage fault at the time of applying a high voltage.

In other words, by making a determination by the capacitive voltage dividing ratio, the voltage dividing circuit configuration itself can freely be changed and also, the diagnostic accuracy can be improved more remarkably than ever before in terms of detection of the leakage fault at the time of applying the high voltage.

Also, when the capacitor C is charged by the charge pump circuit 3 and the charging path 402 is opened by the opening/closing switch 411, the measuring part 8 measures the voltage dividing ratio by the circuit element. Before the capacitor C is charged by the charge pump circuit 3, connection between the measuring part 8 and the assembled battery 9, that is, the power source path 11 is opened by the cut off switch 13.

Hence, with the assembled battery 9 separated from the detection system including the measuring part 8, a diagnostic voltage having an intrinsic voltage ratio instead of each of the cells BT1 to BT3 is generated by being applied to the capacitors C connected in series by the charge pump circuit 3 and thereafter, the voltage is detected using an operation sequence for measuring each of the cells BT1 to BT3.

That is, the voltage having the intrinsic diagnostic voltage ratio corresponding to each of the cells BT1 to BT3 is measured. Accordingly, opening/closing operation of the cut off switch 13 and operation of the self-diagnostic circuit can be checked, and in measurement of the cells BT, connections between paths from the cut off switch 13 to the AD converting part 807 with reference to the cells BT can be checked and further, an operation sequence can be checked.

Further, since the diagnostic voltage (not shown) corresponding to the actual assembled battery 9 is used, for example, when a leakage place is present in an input path, it can be detected that its leakage place is present.

In other words, connection of the circuit network from the cut off switch 13 to the AD converting part 807 with reference to the cells BT can be checked and also, the leakage fault can be detected by voltage detection using the diagnostic voltage corresponding to the actual assembled battery 9.

As described above, the voltage detecting apparatus 1 according to the first embodiment is the voltage detecting apparatus 1 for determining whether or not the circuit network including a part of the measuring part 8 is normal, including the assembled battery 9 made of the plural cells BT, the self-diagnostic circuit 4, and the measuring part 8 for measuring the plural cells BT or measuring the diagnostic voltage generated by the self-diagnostic circuit 4, and electric power is supplied to the self-diagnostic circuit 4 by the charge pump circuit 3, and the self-diagnostic circuit 4 includes the plural circuit elements connected in series, and the current path 401 connected to the measuring part 8 and formed in correspondence with each of the plural circuit elements, and the measuring part 8 includes the multiplexer 801 for switching a state of connection between each of the current paths 401 and the circuit network, and determines whether or not the circuit network is normal based on the voltage dividing ratio by the circuit element corresponding to the current path 401 switched by the multiplexer 801.

By such a configuration, high-accuracy detection can be performed while expanding an input voltage range of the diagnostic voltage (not shown) from a low voltage to a high voltage.

Also, in the voltage detecting apparatus 1 according to the first embodiment, the self-diagnostic circuit 4 further includes the capacitor C for sharing the voltage dividing ratio by the circuit element as the capacitive voltage dividing ratio, and the measuring part 8 determines that the circuit network is normal when the capacitive voltage dividing ratio is equal to the reference capacitive voltage dividing ratio serving as the criterion of the capacitive voltage dividing ratio, and determines that the circuit network is abnormal when the capacitive voltage dividing ratio is different from the reference capacitive voltage dividing ratio.

By such a configuration, by making a determination by the capacitive voltage dividing ratio, the voltage dividing circuit configuration itself can freely be changed and also, diagnostic accuracy can be improved more remarkably than ever before in terms of detection of a leakage fault at the time of applying a high voltage.

Also, in the voltage detecting apparatus 1 according to the first embodiment, the opening/closing switch 411 for opening and closing the charging path 402 between the charge pump circuit 3 and the self-diagnostic circuit 4 is further included, and the measuring part 8 measures the voltage dividing ratio by the circuit element when the capacitor C is charged by the charge pump circuit 3 and the charging path 402 is opened by the opening/closing switch 411.

By such a configuration, connection including the circuit network including the measuring part 8, the current paths 401 and the power source paths 11 can be checked and also, the leakage fault can be detected by voltage detection using the diagnostic voltage (not shown) corresponding to the actual assembled battery 9.

Second Embodiment

In a second embodiment, a power source voltage generating part 2, a charge pump circuit 3, power source paths 11, a cut off switch 13 and a circuit separation switch 15 have a function and a configuration similar to those of the first embodiment. Hence, description of the function and the configuration similar to those of the first embodiment is omitted in the second embodiment.

A self-diagnostic circuit 5 in the second embodiment is configured to differ from the self-diagnostic circuit 4 in the first embodiment. Hence, the self-diagnostic circuit 5 configured to differ from the self-diagnostic circuit 4 in the first embodiment will be described concretely.

Figure 4:
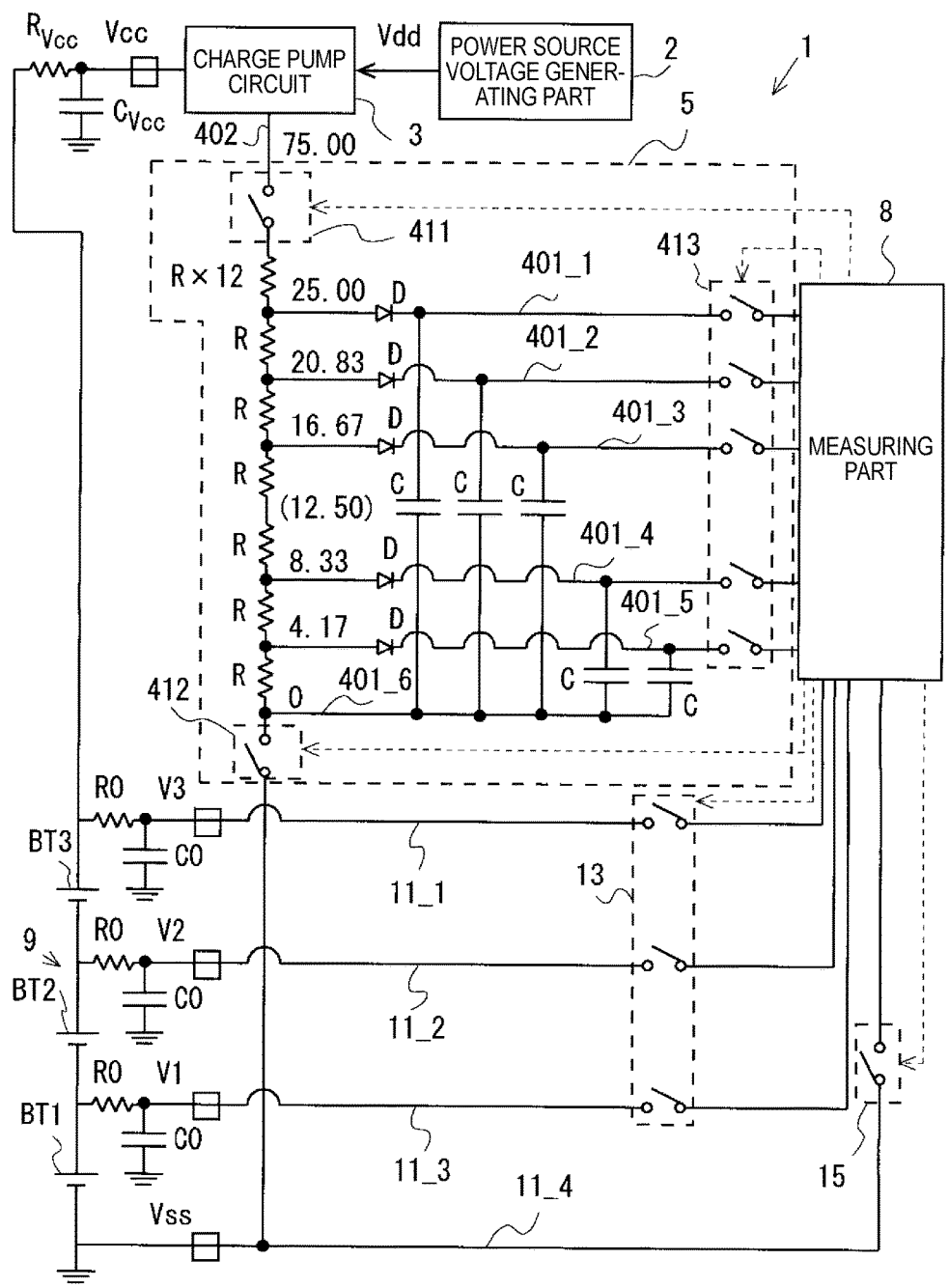
FIG. 4 is a diagram showing a circuit configuration example of a voltage detecting apparatus 1 according to a second embodiment.

FIG. 4 is a diagram showing a circuit configuration example of a voltage detecting apparatus 1 according to the second embodiment. Electric power is supplied to the self-diagnostic circuit 5 by the charge pump circuit 3. The self-diagnostic circuit 5 includes plural circuit elements connected in series, and current paths 401_1 to 401_5 connected to a measuring part 8 and formed in correspondence with the plural circuit elements.

Concretely, the self-diagnostic circuit 5 includes a resistor R for sharing a voltage dividing ratio by the circuit element as a resistive voltage dividing ratio. The self-diagnostic circuit 5 includes a connection switch 413. The connection switch 413 switches a state of connection between each of the current paths 401_1 to 401_5 and a circuit network.

In the voltage dividing ratio by the circuit element, various voltage dividing ratios can be selected by setting a balance of the resistor R at any value and pulling the current paths 401_1 to 401_5 out of any point of a resistor array.

Each of the current paths 401_1 to 401_5 is provided with a diode D, and the anode side is connected to the side of the resistor R, and the cathode side is connected to the connection switch 413. The diode D inhibits an electric charge instantaneously charged into a capacitor C from being lost involuntarily.

In addition, when any of the current paths 401_1 to 401_5 are not particularly limited, the current paths 401_1 to 401_5 are called the current paths 401.

Also, in each of the current paths 401_1 to 401_5, the capacitor C is respectively connected to the cathode side of the diode D. The first end of the capacitor C is connected to the cathode side of the diode D, and the second end of the capacitor C is connected to a current path 401_6.

Figure 5:
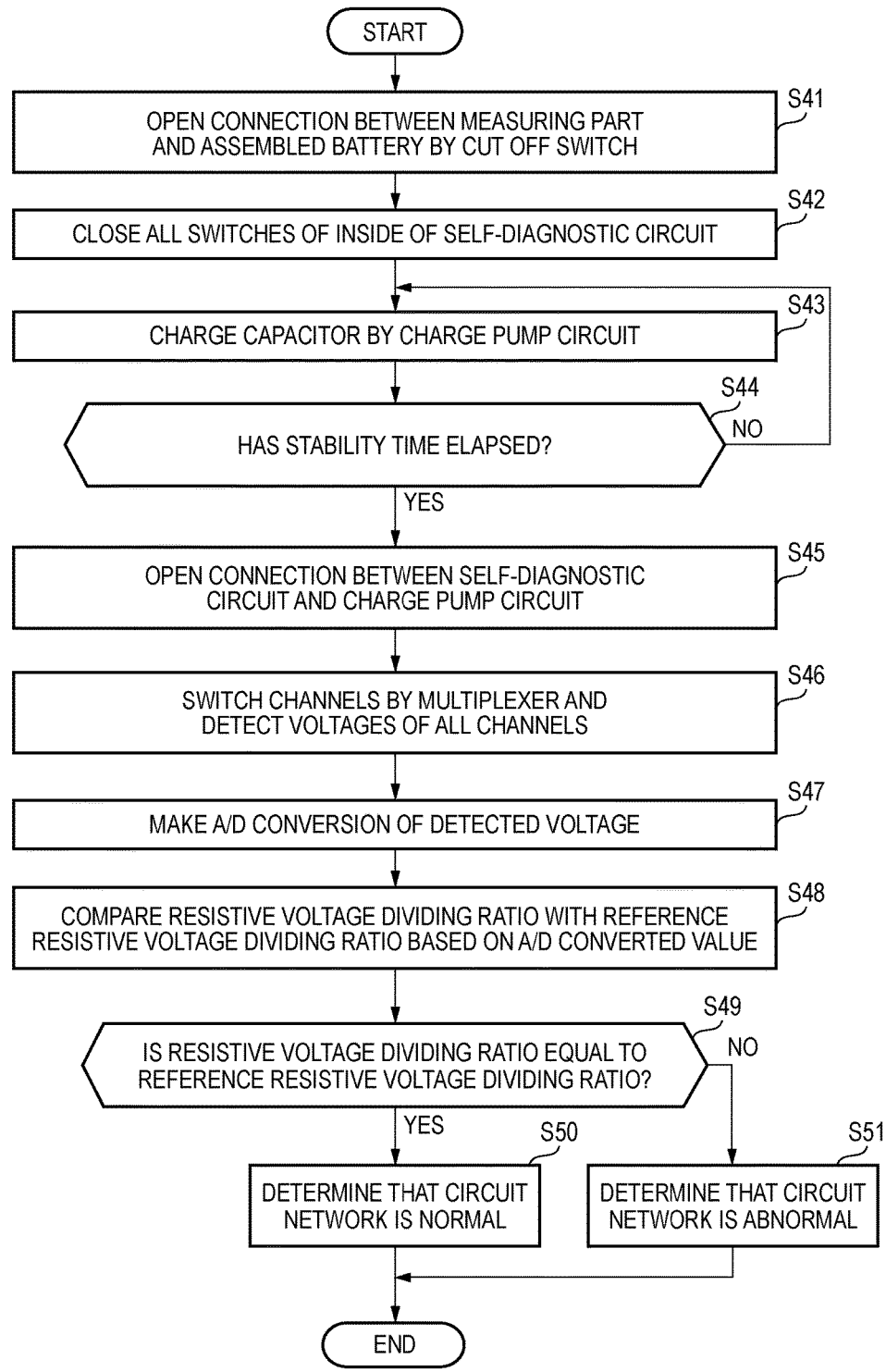
FIG. 5 is a flowchart describing a control example of the voltage detecting apparatus 1 according to the second embodiment.

Next, operation of determining whether or not the circuit network including the measuring part 8 is normal by using the self-diagnostic circuit 5 will be described using FIG. 5. FIG. 5 is a flowchart describing a control example of the voltage detecting apparatus 1 according to the second embodiment. In addition, in comparison between the flowchart in the second embodiment and the flowchart in the first embodiment, the processing of Steps S11 to S17 and the processing of Steps S20 and S21 are similar to processing of Steps S41 to S47 and processing of Steps S50 and S51, with the result that this description is omitted.

(Step S48)

A data processing part 809 compares a resistive voltage dividing ratio obtained by measurement with a known reference resistive voltage dividing ratio which is a criterion of its resistive voltage dividing ratio, based on an A/D converted value. In addition, the A/D converted value refers to a digital voltage signal converted by an AD converting part 807.

(Step S49)

The data processing part 809 compares whether or not the resistive voltage dividing ratio is equal to the reference resistive voltage dividing ratio. When the resistive voltage dividing ratio is equal to the reference resistive voltage dividing ratio, the flowchart proceeds to processing of step S50. On the other hand, when the resistive voltage dividing ratio is not equal to the reference resistive voltage dividing ratio, the flowchart proceeds to processing of step S51.

From the above description, the self-diagnostic circuit 5 includes the resistor R for sharing the voltage dividing ratio by the circuit element as the resistive voltage dividing ratio. The measuring part 8 determines whether or not the circuit network including the measuring part 8 is normal based on the resistive voltage dividing ratio and the reference resistive voltage dividing ratio.

Hence, a diagnostic voltage is generated by a circuit configuration by resistive voltage dividing. As a result, it can be determined that the circuit network is normal when the diagnostic voltage keeps a voltage ratio corresponding to each cell BT and also keeps a voltage ratio of each channel including the current path 401.

Also, in the example described above, the diagnostic voltage is generated using one cell BT as an upper limit of the diagnostic voltage, that is, the reference, with the result that the voltage dividing circuit configuration itself can freely be changed though a maximum applied voltage is decreased.

For example, the uppermost channel can be changed into a voltage substantially similar to a battery voltage of an assembled battery 9. That is, any voltage less than or equal to a battery voltage equivalent to the assembled battery 9 can be applied to a charging path 402. Further, the diagnostic voltage can be set at a voltage more than or equal to a reference power source voltage by controlling the diagnostic voltage using a diagnostic voltage ratio. Consequently, diagnostic accuracy can be improved more remarkably than ever before in terms of detection of a leakage fault at the time of applying a high voltage.

In other words, by making a determination by the resistive voltage dividing ratio, the voltage dividing circuit configuration itself can freely be changed and also, the diagnostic accuracy can be improved more remarkably than ever before in terms of detection of the leakage fault at the time of applying the high voltage.

As described above, in the voltage detecting apparatus 1 according to the second embodiment, the self-diagnostic circuit 5 further includes the resistor R for sharing the voltage dividing ratio by the circuit element as the resistive voltage dividing ratio, and the capacitor C corresponding to the resistive voltage dividing ratio, and the measuring part 8 determines that the circuit network is normal when the resistive voltage dividing ratio is equal to the reference resistive voltage dividing ratio serving as the criterion of the resistive voltage dividing ratio, and determines that the circuit network is abnormal when the resistive voltage dividing ratio is different from the reference resistive voltage dividing ratio.

By such a configuration, by making the determination by the resistive voltage dividing ratio, the voltage dividing circuit configuration itself can freely be changed and also, the diagnostic accuracy can be improved more remarkably than ever before in terms of detection of the leakage fault at the time of applying the high voltage.

The invention has been described above based on the first and second embodiments, but the invention is not limited to the first and second embodiments described above, and changes may be made without departing from the gist of the invention.

For example, in the first embodiment, one example using the capacitor C for sharing the voltage dividing ratio by the circuit element as the capacitive voltage dividing ratio is described, but the embodiment is not limited to this example, and the circuit element including a capacitive component may be used.

Also, in the second embodiment, one example using the resistor R for sharing the voltage dividing ratio by the circuit element as the resistive voltage dividing ratio is described, but the embodiment is not limited to this example, and the circuit element including a resistive component may be used.

What is claimed is:

1. A voltage detecting apparatus for determining whether or not a circuit network including a part of a measuring part is normal, comprising:
    an assembled battery made of plural cells,
    a self-diagnostic circuit, and
    the measuring part for measuring the plural cells or measuring a diagnostic voltage generated by the self-diagnostic circuit, wherein
    electric power is supplied to the self-diagnostic circuit by a charge pump circuit,
    the self-diagnostic circuit comprises
        plural circuit elements connected in series, and
        a current path connected to the measuring part and formed in correspondence with each of the plural circuit elements, and
    the measuring part comprises a multiplexer for switching a state of connection between each of the current paths and the circuit network,
    the measuring part determines whether or not the circuit network is normal based on a voltage dividing ratio by the circuit element corresponding to the current path switched by the multiplexer, and
    the measuring part respectively measures the diagnostic voltage that is a difference between voltages of a pair of the current paths corresponding to each of the plural cells, and calculates a ratio of the measured plural diagnostic voltages as the voltage dividing ratio.

2. The voltage detecting apparatus according to claim 1, wherein
    the self-diagnostic circuit further comprises a capacitor for sharing the voltage dividing ratio by the circuit element as a capacitive voltage dividing ratio, and
    the measuring part determines that the circuit network is normal when the capacitive voltage dividing ratio is equal to a reference capacitive voltage dividing ratio serving as a criterion of the capacitive voltage dividing ratio, and determines that the circuit network is abnormal when the capacitive voltage dividing ratio is different from the reference capacitive voltage dividing ratio.

3. The voltage detecting apparatus according to claim 1, wherein the self-diagnostic circuit further comprises a resistor for sharing the voltage dividing ratio by the circuit element as a resistive voltage dividing ratio, and a capacitor corresponding to the resistive voltage dividing ratio, and the measuring part determines that the circuit network is normal when the resistive voltage dividing ratio is equal to a reference resistive voltage dividing ratio serving as a criterion of the resistive voltage dividing ratio, and determines that the circuit network is abnormal when the resistive voltage dividing ratio is different from the reference resistive voltage dividing ratio.

4. The voltage detecting apparatus according to claim 2, further comprising an opening/closing switch for opening and closing a charging path between the charge pump circuit and the self-diagnostic circuit, wherein the measuring part measures the voltage dividing ratio by the circuit element when the capacitor is charged by the charge pump circuit and the charging path is opened by the opening/closing switch.

* * * * *